United States Patent [19]

Wilczak

[11] Patent Number: 5,707,781
[45] Date of Patent: Jan. 13, 1998

[54] PHOTOPOLYMERIZABLE COMPOSITIONS HAVING ACYL OR DIACYL PHOSPHINE OXIDE AND A FLUORESCENT OPTICAL BRIGHTNER

[75] Inventor: Wojciech A. Wilczak, Jersey City, N.J.

[73] Assignee: Bayer Corporation, Pittsburgh, Pa.

[21] Appl. No.: 435,560

[22] Filed: May 5, 1995

[51] Int. Cl.$^6$ .................................... G03C 1/73
[52] U.S. Cl. ..................... 430/281.1; 430/270.1; 430/913; 430/915; 430/933; 522/64; 522/28
[58] Field of Search ............... 430/281.1, 270.1, 430/913, 915, 933; 522/28, 64

[56] References Cited

U.S. PATENT DOCUMENTS

| | | | |
|---|---|---|---|
| 2,784,183 | 3/1957 | Keller et al. | 252/543 |
| 3,644,394 | 2/1972 | Gurney | 252/301.27 |
| 3,854,950 | 12/1974 | Held . | |
| 4,292,152 | 9/1981 | Lechtken et al. . | |
| 4,868,091 | 9/1989 | Boettcher et al. | 430/281.1 |
| 5,100,929 | 3/1992 | Jochum et al. | 522/64 |
| 5,218,009 | 6/1993 | Rutsch et al. | 522/64 |
| 5,300,399 | 4/1994 | Wilczak | 430/253 |
| 5,399,770 | 3/1995 | Leppard et al. | 568/15 |
| 5,399,782 | 3/1995 | Leppard et al. | 522/64 |
| 5,472,992 | 12/1995 | Leppard et al. | 522/64 |
| 5,534,559 | 7/1996 | Leppard et al. | 522/64 |
| 5,559,163 | 9/1996 | Dawson et al. | 522/22 |

FOREIGN PATENT DOCUMENTS

| | | |
|---|---|---|
| 0 298 030 A3 | 4/1989 | European Pat. Off. . |
| 0 412 495 A2 | 2/1991 | European Pat. Off. . |
| 0 446 175 A2 | 9/1991 | European Pat. Off. . |
| 3619792 | 12/1987 | Germany . |
| 4-178403 | 6/1992 | Japan . |

*Primary Examiner*—George F. Lesmes
*Assistant Examiner*—Laura Werner
*Attorney, Agent, or Firm*—Roberts & Mercanti, L.L.P.

[57] ABSTRACT

The present invention relates a photopolymerizable composition which comprises:

A) one or more ethylenically unsaturated, free-radical polymerizable monomers;
B) one or more organic binders; and
C) one or more photoinitiators, wherein the photoinitiator is an acyl or diacyl phosphine oxide, in combination with a fluorescent optical brightener;

and a process for producing such a photopolymerizable composition.

23 Claims, No Drawings

PHOTOPOLYMERIZABLE COMPOSITIONS HAVING ACYL OR DIACYL PHOSPHINE OXIDE AND A FLUORESCENT OPTICAL BRIGHTNER

DESCRIPTION

1. Field of the Invention

The present invention relates to improved photopolymerizable compositions useful in color proofing films and printing plates capable of producing images upon treatment with actinic radiation.

2. Background of the Invention

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates, which are then utilized to finally reproduce the color image.

Photopolymerizing and photocrosslinking compounds have widespread applications in the industry. For example, processes related to coatings, photoresists, lithographic plates and the like are based on such compounds. Photopolymerization and photocrosslinking have been subject of several review articles such as, for example, in *Encyclopedia of Polymer Science and Engineering* Volume 4, page 350 (John Wiley & Sons, Inc., New York, 1986) and ibid., Vol. 11, 187 (1988). Generally, photoreactive compositions contain monomers which, under the action of light, polymerize (photopolymerization) or crosslink when additional monomers are present (photocrosslinking). They may also crosslink on their own if they are multifunctional. A photoinitiator (or photosensitizer) is generally used in such reactions, although it is not always necessary.

Photopolymerizable mixtures comprising a polymerizable monomer, a binder and a photoinitiator are well known in the prior art. Such compositions are described in general in U.S. Pat. Nos. 3,782,961; 3,850,770; 3,960,572, 4,019, 972; and 4,250,248. German Patent DOS 2,040,390 and French Patent 1,520,856 describe the use of aromatic ketones such as benzil ketals, benzoin ethers, and alpha-methylol derivatives of benzoin ethers. For these compositions very long exposure times are normally necessary because of lower than acceptable photosensitivity.

Photopolymerizable monomers are also known in the art which contain certain combinations of photoinitiators and activitators to increase photosensitivity. Among these are, for example, combinations of carbonyl group-containing initiators and tertiary amines. Such mixtures displaying a synergistic effect are described in U.S. Pat. Nos. 4,054,682; 4,071;424; and 3,759,807. A disadvantage of these mixtures is that they have a relatively short shelf life because the amines can easily bleed out, in particular from a coating.

U.S. Pat. No. 4,292,152 describes the use of acyl phosphine oxide initiators to improve the photosensitivity of polymerizable compositions. These compositions are faster (more photosensitive) than the other prior art compositions. However, they are still not sufficiently photosensitive to substantially reduce the irradiation time in today's UV curing and imaging industry.

Fluorescent brighteners have been used as additives in some photohardenable materials to alleviate undesirable yellowing of the film, as taught in U.S. Pat. Nos. 3,644,394; 2,784,183; and 2,563,493. Fluorescent brighteners have also been shown to reduce halation effects in photohardenable compositions, as described in U.S. Pat. No. 3,854,950.

U.S. Pat. No. 5,300,399 teaches a negative-acting color proofing element. The element sequentially comprises a strippable cover sheet which is transparent to actinic radiation; a crosslinked layer containing a polymer having phenolic groups; a color layer, containing a colorant, a polymeric binder, a polymerizable monomer and, optionally, a photoinitiator; a photoadhering layer, containing a linear photosensitive polymer containing ethylenically unsaturated, free-radical polymerizable groups and having a molecular weight greater than 3,000, a polymerizable monomer, and, optionally, a free radical photoinitiator; a thermoplastic adhesive layer; and a receiver sheet, at least one of the color layer and the photoadhering layer containing the photoinitiator.

However, it is sometimes desirable to blanket-expose the finished proof to actinic radiation in order to photoharden the top layer in order to provide blocking-and-scratch resistance. It was found that the photoadhering layer taught in U.S. Pat. No. 5,300,399 becomes discolored (yellows) when exposed to UV-light.

It is an object of the present invention to provide even more reactive initiators for rapid crosslinking of polymerizable compositions. It is also an object of the present invention to provide photopolymerizable which can be used in a color proofing element or on a printing plate. When utilized in color proofing, the polymerizable composition of the present invention remedies unwanted discoloration when a color proofing element is exposed to UV-light. These objects have been achieved, surprisingly, by incorporating fluorescent brighteners into the photoinitiator composition, along with an acyl or diacyl phosphine oxide. The prior art does not suggest the photosensitivity-enhancing properties of fluorescent brighteners on acyl or diacyl phosphine oxide photoinitiators. The composition and process of the present invention provide a five- to ten-fold increase in the photosensitivity of compositions when compared with the same compositions lacking the fluorescent brightener.

SUMMARY OF THE INVENTION

In the present invention, one produces a photopolymerizable composition which comprises:

1) one or more ethylenically unsaturated, free-radical polymerizable monomers;
2) one or more organic binders; and
3) one or more photoinitiators, wherein the photoinitiator is an acyl or diacyl phosphine oxide, in combination with a fluorescent optical brightener.

The present invention also relates to a process for producing a photopolymerizable composition by providing an admixture of:

1) one or more ethylenically unsaturated, free-radical polymerizable monomers;
2) one or more organic binders; and
3) a combination of an acyl or diacyl phosphine oxide and a fluorescent optical brightener.

DETAILED DESCRIPTION OF THE PREFERRED EMBODIMENT

The ethylenically unsaturated, free radical polymerizable monomers in the photopolymerizable composition of the present invention preferably comprise addition polymerizable, non-gaseous (boiling temperature above 100° C. at normal atmospheric pressure), ethylenically-unsaturated organic compounds containing at least one, and preferably at least two, terminal ethylenically unsaturated groups, and being capable of forming a high weight average molecular weight polymer by free radical initiated, chain propagating addition polymerization. The most preferred compounds are acrylate or methacrylate monomers, as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate.

Other useful monomers include the urethane monomers described in copending U.S. application Ser. No. 221,676 filed on Apr. 1, 1994, now U.S. Pat. No. 5,436,112. These monomer may be prepared by reacting an isocyanate with a partial ester of acrylic acid or methacrylic acid and a polyhydric alcohol. They may also be provided by reacting an acrylate such as dipentaerythritol pentaacrylate with an isocyanate such as 2-heptyl-3,4-bis-(9-isocyanatononyl)-1-pentyl cyclohexane.

Free radical liberating photoinitiators used in the photopolymerizable composition of the present invention are a combination of an acyl or diacyl phosphine oxides and a fluorescent optical brightener. Copending U.S. application Ser. No. 08/435,906 now U.S. Pat. No. 5,660,968, filed on the same date as this Application, describes a color proofing element and method for producing such a color proofing element, wherein the color proofing element utilizes the photopolymerizable composition of the present invention, which contains as a photoinitiator an acyl or diacyl phosphine oxide compound, in combination with a fluorescent optical brightener. Surprisingly, this combination, when used in the top layer of a color proofing element, not only does not substantially change color on exposure to actinic light, but also protects the lower layers from harmful radiation.

The acyl and diacyl phosphine oxides which may be utilized in the photoinitiator, respectively, have the following formulas I and II:

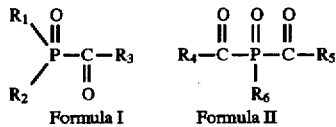

where:

$R_1$ and $R_6$ is a branched or unbranched alkyl of 1 to 18 carbon atoms, substituted or unsubstituted cycloalkyl of 5 or 6 carbon atoms, $C_6$–$C_{18}$ aryl which is unsubstituted or substituted by $C_1$–$C_{18}$ alkyl or $C_1$–$C_{18}$ alkoxy, or an S-containing or N-containing five-membered or six-membered heterocyclic radical, $R_1$ and $R_6$ being the same or different, $R_2$ has the same meaning as $R_1$, or is $C_1$–$C_{18}$ alkoxy, $C_6$–$C_{18}$ aryloxy or aralkoxy ($C_6$–$C_{18}$ aryl, $C_1$–$C_{18}$ alkyl), $R_1$ and $R_2$ being the same of different or together to form a ring and $R_3$, $R_4$ and $R_5$ are a tertiary alkyl of 4 to 18 carbon atoms, or a tertiary cycloalkyl of 5 or 6 carbon atoms, or is a $C_6$–$C_{18}$ cycloalkyl, $C_6$–$C_{18}$ aryl, or 5-membered or 6-membered heterocyclic radical containing S, N or O as heteroatoms which contain substituents A and B bonded at least to the two ring carbon atoms, capable of substitution, which are adjacent to the point of attachment to the carbonyl group of the $R_3$ group, A and B being identical or different, and each being $C_1$–$C_{18}$ alkyl, $C_1$–$C_{18}$ alkoxy, $C_1$–$C_{18}$ alkoxy, $C_1$–$C_{18}$ alkyl, $C_1$–$C_{18}$ alkylthio, $C_6$–$C_{18}$ cycloalkyl, $C_6$–$C_{18}$ aryl or halogen. $R_3$, $R_4$ and $R_5$ can be the same of different.

Fluorescent optical brighteners which may be utilized in the photopolymerizable composition of the present invention include those described in U.S. Pat. Nos. 2,784,183 and 3,644,394. Particularly preferred are 2,2'-(thiophenediyl)-bis-(t-butyl benzoxazole); 2-(stibyl-4")-(naphtho-1',2',4,5)-1,2,3-triazole-2"-sulfonic acid phenyl ester; and 7-(4'-chloro-6"-diethylamino-1',3',5'-triazine-4'-yl)amino-3-phenyl coumarin. Fluorescent optical brighteners whose building blocks include one or more of stilbene, triazine, thiazole, benzoxazole, coumarin, xanthene, triazole, oxazole, thiophene or pyrazoline may be utilized in the photopolymerizable composition of the present invention.

Suitable binder resins are those well known in the art and may include styrene/maleic anhydride copolymers and their half esters; acrylic polymers and copolymers; polyamides; polyvinyl pyrrolidones; cellulosic resins; phenolic resins; polyvinyl acetals; polyvinyl acetates and their coplyomers; and mixtures thereof In the practice of the present invention, the one or more ethylenically unsaturated, free radical polymerizable monomers are preferably present in the photopolymerizable composition in an amount ranging from about 5 to 70% based on the weight of the solids in the composition. A preferred range is from about 10 to 60%, more preferably from about 20 to 50%.

In the practice of the present invention, the one or more organic binders are preferably present in the photopolymerizable composition in an amount sufficient to bind the components in a uniform mixture and to provide a uniform film, ranging from about 20 to 80% based on the weight of the solids in the composition. A preferred range is from about 30 to 75%, more preferably from about 40 to 70%.

In the practice of the present invention, the one or more photoinitiators are preferably present in the photopolymerizable composition in an amount ranging from about 1 to 30% based on the weight of solids in the composition. A preferred range is from about 3 to 20%, more preferably from about 5 to 15%.

The following nonlimiting examples serve to illustrate the present invention.

COMPARATIVE EXAMPLE 1

The following photosensitive solution was prepared:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. 2,4,6-trimethylbenzoyl-diphenylphosphine oxide (Lucirin® TPO available from BASF)—1 gram;
4. Methyl Ethyl Ketone—89 grams This solution was coated on 3 mil thick clear polyester sheet (Melinex® 505 available from ICI) with a Meyer® rod #12, and dried in an oven for 2 minutes to give a clear film. This film was exposed through an UGRA target for 1 minute in a Theimer® unit equipped with a 5 kW lamp, and developed with a CPD (Enco Divsion of Hoechst Celanese Corporation) Color Proofing developer. The number of photohardened solid steps on the Stouffer stepwedge indicated functional photospeed. Four (4) solid steps were obtained.

EXAMPLE 1

The procedure of Comparative Example 1 was repeated, except 1 gram of a fluorescent brightener (Uvitex® OB available from Ciba) was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. 2,4,6-trimethylbenzoyl-diphenylphosphine oxide (Lucirin® TPO available from BASF)—1 gram
4. 2,2'-(2,5thiophenediyl)bis[t-butylbenzoxazole) (Uvitex® OB available from Ciba)—1 gram;
5. Methyl Ethyl Ketone—88 grams.

The procedure was repeated as in Comparative Example 1. The film after development gave solid step 10.

EXAMPLE 2

Example 1 was repeated, except the Uvitex® OB was replaced with an equal amount of fluorescent brightener Hakkol® PY-1800 (available from Hakkol Chemical Co., Japan), 7-4(4'-chloro-6'-diethylamino-1'-3'-5'-triazine4'-yl) amino-3-phenyl coumarin, which was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. 2,4,6-trimethylbenzoyl-diphenylphosphine oxide (Lucirin® TPO available from BASF)—1 gram;
4. 7-(4'-chloro-6'-diethylamino-1'-3'-5'-triazine-4'-yl)amino-3-phenyl coumarin (Hakkol® PY-1800)—1 gram;
5. Methyl Ethyl Ketone—88 grams.

After development, solid step 9 was obtained.

EXAMPLE 3

Example 2 was repeated, except the Hakkol® PY-1800 was replaced with an equal amount of a fluorescent brightener 7-diethylamino-4-methylcoumarin, which was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. 2,4,6-trimethylbenzoyl-diphenylphosphine oxide (Lucirin® TPO available from BASF)—1 gram;
4. 7-diethylamino4-methylcoumarin-1 gram;
5. Methyl Ethyl Ketone—88 grams.

Solid step 11 was obtained.

EXAMPLE 4

Example 3 was repeated, except 7-diethylamino4-methylcoumarin was replaced with an equal amount of Eastobrite® OB-1 Fluorescent Brightener (available from Eastman Chemical Company), 2,2'-(1,2-Ethanediyldi-4,1-phenylene)bisbenzoxazole, which was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams; 3. 2,4,6-trimethylbenzoyl-diphenylphosphine oxide (Lucirin® TPO available from BASF)—1 gram;
4. 2,2'-(1,2-Ethanediyldi4,1-phenylene)bisbenzoxazole, Eastobrite® OB-1 Fluorescent Brightener (available from Eastman Chemical Company)—1 gram;
5. Methyl Ethyl Ketone—88 grams.

A solid step 11 was obtained.

COMPARATIVE EXAMPLE 2

Comparative Example 1 was repeated, except the 2,4,6-trimethylbenzoyl-diphenylphosphine oxide (Lucirin® TPO available from BASF) was replaced with an equal amount of bis (2,6-dimethoxybenzoyl)-2,4,4-trimethyl pentyl phosphine oxide (CGI® 403 available from Ciba Corporation), which was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. Bis(2,6-dimethoxybenzoyl)-2,4,4-trimethyl pentyl phosphine oxide (CGI® 403 available from Ciba Corporation—1 gram;
4. Methyl Ethyl Ketone—89 grams.

After exposure and development the material gave solid step 5.

EXAMPLE 5

Comparative Example 2 was repeated, except 1 gram of a fluorescent brightener (Uvitex® OB available from Ciba) was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. Bis(2,6-dimethoxybenzoyl)-2,4,4-trimethyl pentyl phosphine oxide (CGI® 403 available from Ciba Corporation—1 gram;
4. 2,2'-(2,5-thiophenediyl)bis[t-butylbenzoxazole) (Uvitex® OB available from Ciba)—1 gram;
5. Methyl Ethyl Ketone—88 grams.

After exposure and development the material gave solid step 10.

EXAMPLE 6

Example 5 was repeated, except Uvitex® OB was replaced with an equal amount of fluorescent brightener Hakkol® PY-1800 (available from Hakkol Chemical Co., Japan), 7-(4-'chloro-6'-diethylamino-1'-3'-5'triazine4'-yl) amino-3-phenyl coumarin, which was added to the solution:
1. Styrene/maleic anhydride half ester copolymer resin (Scriptset® 540 available fore Monsanto)—5 grams;
2. Dipentaerythritol pentaacrylate (Sartomer® 399 available from Sartomer Co.)—5 grams;
3. Bis(2,6-dimethoxybenzoyl)-2,4,4-trimethyl pentyl phosphine oxide (CGI® 403 available from Ciba Corporation—1 gram;
4. 7-(4-'chloro-6'-diethylamino-1'-3'-5'triazine-4'-yl)amino-3-phenyl coumarin—1 gram;
5. Methyl Ethyl Ketone—88 grams.

After exposure and development the material gave solid step 11.

EXAMPLE 7

Example 6 was repeated, except Hakkol® PY-1800 was replaced with an equal mount of a fluorescent brightener 7-diethylamino-4-methylcoumarin, which was added to the solution:
1. Styrene/maleic anhydride half ester copolymer resin (Scriptset® 540 available fore Monsanto)—5 grams;
2. Dipentaerythritol pentaacrylate (Sartomer 399 available fore Sartomer Co.)—5 grams;

3. Bis(2,6-dimethoxybenzoyl)-2,4,4-trimethyl pentyl phosphine oxide (CGI® 403 available from Ciba Corporation—1 gram;
4. 7-diethylamino-4-methylcoumarin—1 gram;
5. Methyl Ethyl Ketone—88 grams.

After exposure and development the material gave a solid step 12.

EXAMPLE 8

Example 7 was repeated, except 7-diethylamino-4-methylcoumarin was replaced with an equal amount of Eastobrite® OB-1 Fluorescent Brightener (available from Eastman Chemical Company), 2,2'-(1,2-Ethanediyldi-4,1-phenylene)bisbenzoxazole, which was added to the solution:
1. Styrene/maleic anhydride half ester copolymer resin (Scriptset® 540 available from Monsanto)—5 grams;
2. Dipentaerythritol pentaacrylate (Sartomer® 399 available from Sartomer Co.)—5 grams;
3. Bis(2,6-dimethoxybenzoyl)-2,4,4-trimethyl pentyl phosphine oxide (CGI® 403 available from Ciba Corporation—1 gram;
4. 2,2'-(1,2-Ethanediyldi-4,1-phenylene)bisbenzoxazole, Eastobrite® OB-1 Fluorescent Brightener (available from Eastman Chemical Company)—1 gram;
5. Methyl Ethyl Ketone—88 grams.

After exposure and development the material gave a solid step 11.

EXAMPLE 9

Example 8 was repeated, except the photosensitive solution was coated on grained and anodized aluminum surface, giving a planographic printing plate.

After exposure and development the printing plate gave a solid step 13.

What is claimed is:

1. A photopolymerizable composition which comprises:
   A) one or more ethylenically unsaturated, free-radical polymerizable monomers;
   B) one or more organic binders; and
   C) one or more photoinitiators, wherein the photoinitiator is an acyl or diacyl phosphine oxide, in combination with a fluorescent optical brightener selected from the group consisting of 2,2'-(thiophenediyl)-bis-(t-butyl benzoxazole); 2-(stibyl-4")-(naphtho-1',2',4,5)-1,2,3-triazole- 2"-sulfonic acid phenyl ester; 7-(4'-chloro-6"-diethylamino-1',3',5'-triazine-4'-yl)amino-3-phenyl coumarin;
wherein said optical brightener is present in an amount sufficient to enhance the photosensitivity of the acyl or diacyl phosphine oxide.

2. The composition of claim 1 comprising from about 20 weight percent to about 50 weight percent of the one or more ethylenically unsaturated, free-radical polymerizable monomers; from about 40 weight percent to about 70 weight percent of the one or more organic binders; and from about 5 weight percent to about 15 weight percent of the one or more photoinitiators.

3. The composition of claim 1 comprising from about 10 weight percent to about 60 weight percent of the one or more ethylenically unsaturated, free-radical polymerizable monomers.

4. The composition of claim 1 comprising from about 5 weight percent to about 70 weight percent of the one or more ethylenically unsaturated, free-radical polymerizable monomers.

5. The composition of claim 1 comprising from about 20 weight percent to about 80 weight percent of the one or more organic binders.

6. The composition of claim 1 comprising from about 30 weight percent to about 70 weight percent of the one or more organic binders.

7. The composition of claim 1 comprising from about 3 weight percent to about 20 weight percent of the one or more photoinitiators.

8. The composition of claim 1 comprising from about 1 weight percent to about 30 weight percent of the one or more photoinitiators.

9. The composition of claim 1 wherein the one or more ethylenically unsaturated, free-radical polymerizable monomers is an acrylate or methacrylate.

10. The composition of claim 1 wherein the one or more organic binders is selected from the group consisting of styrene/maleic anhydride copolymers and their half esters; acrylic polymers and copolymers; polyamides; polyvinyl pyrrolidones; cellulosic resins; phenolic resins; polyvinyl acetals; polyvinyl acetates and their copolymers; and mixtures thereof.

11. The composition of claim 1 wherein the acryl and diacyl phosphine oxide have the following formulas:

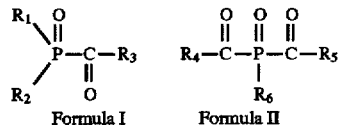

Formula I   Formula II where:

$R_1$ and $R_6$ is a branched or unbranched alkyl of 1 to 18 carbon atoms, substituted or unsubstituted cycloalkyl of 5 or 6 carbon atoms, $C_6$–$C_{18}$ aryl which is unsubstituted or substituted by a $C_1$–$C_{18}$ alkyl or $C_1$–$C_{18}$ alkoxy, or an S-containing or N-containing five-membered or six-membered heterocyclic radical, $R_1$ and $R_6$ being the same or different, $R_2$ has the same meaning as $R_1$, or is $C_1$–$C_{18}$ alkoxy, $C_6$–$C_{18}$ aryloxy or aralkoxy ($C_6$–$C_{18}$ aryl, $C_1$–$C_{18}$ alkyl), $R_1$ and $R_2$ being the same or different or together to form a ring; and $R_3$, $R_4$ and $R_5$ are a tertiary alkyl of 4 to 18 carbon atoms, or a tertiary cycloalkyl of 5 or 6 carbon atoms, or is a $C_6$–$C_{18}$ cycloalkyl, $C_6$–$C_{18}$ aryl, or 5-membered or 6-membered heterocyclic radical containing S, N or O as heteroatoms which contain substituents A and B bonded at least to the two ring carbon atoms, capable of substitution, which are adjacent to the point of attachment to the carbonyl group of the $R_3$ group, A and B being identical or different, and each being $C_1$–$C_{18}$ alkyl, $C_1$–$C_{18}$ alkoxy, $C_1$–$C_{18}$ alkoxy, $C_1$–$C_{18}$ alkyl $C_1$–$C_{18}$ alkylthio, $C_6$–$C_{18}$ cycloalkyl, $C_6$–$C_{18}$ aryl or halogen, $R_3$, $R_4$ and $R_5$ can be the same or different.

12. A process for enhancing the photosensitivity of a photopolymerizable composition which composition comprises an admixture of:
   A) one or more ethylenically unsaturated, free-radical polymerizable monomers;
   B) one or more organic binders; and
   C) an acyl or diacyl phosphine oxide compound, the process comprising combining with said admixture a fluorescent optical brightener selected from the group consisting of 2,2'-(thiophenediyl)-bis-(t-butyl benzoxazole); 2-(stibyl-4")-(naphtho-1',2',4,5)-1,2,3-triazole-2"-sulfonic acid phenyl ester; 7-(4'-chloro-6"-diethylamino-1',3',5'-triazine-4'-yl)amino-3-phenyl coumarin;

wherein said optical brightener is present in an amount sufficient to enhance the photosensitivity of the acyl or diacyl phosphine oxide.

13. The process of claim 12 comprising from about 20 weight percent to about 50 weight percent of the one or more ethylenically unsaturated, free-radical polymerizable monomers; from about 40 weight percent to about 70 weight percent of the one or more organic binders; and from about 5 weight percent to about 15 weight percent of the one or more photoinitiators.

14. The process of claim 12 comprising from about 10 weight percent to about 60 weight percent of the one or more ethylenically unsaturated, free-radical polymerizable monomers.

15. The process of claim 12 comprising from about 5 weight percent to about 70 weight percent of the one or more ethylenically unsaturated, free-radical polymerizable monomers.

16. The process of claim 12 comprising from about 20 weight percent to about 80 weight percent of the one or more organic binders.

17. The process of claim 12 comprising from about 30 weight percent to about 70 weight percent of the one or more organic binders.

18. The process of claim 12 comprising from about 3 weight percent to about 20 weight percent of the one or more photoinitiators.

19. The process of claim 12 comprising from about 1 weight percent to about 30 weight percent of the one or more photoinitiators.

20. The process of claim 12 wherein the one or more ethylenically unsaturated, free-radical polymerizable monomers is an acrylate or methacrylate.

21. The process of claim 12 wherein the one or more organic binders is selected from the group consisting of styrene/maleic anhydride copolymers and their half esters; acrylic polymers and copolymers; polyamides; polyvinyl pyrrolidones; cellulosic resins; phenolic resins; polyvinyl acetals; polyvinyl acetates and their copolymers; and mixtures thereof.

22. The process of claim 12 wherein the acyl and diacyl phosphine oxide has the following formulas:

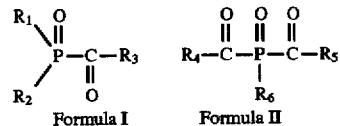

where:

$R_1$ and $R_6$ is a branched or unbranched alkyl of 1 to 18 carbon atoms, substituted or unsubstituted cycloalkyl of 5 or 6 carbon atoms, $C_6$–$C_{18}$ aryl which is unsubstituted or substituted by $C_1$–$C_{18}$ alkyl or $C_1$–$C_{18}$ alkoxy, or aryl S-containing or N-containing five-membered or six-membered heterocyclic radical, $R_1$ and $R_6$ being the same or different, $R_2$ has the same meaning as $R_1$, or is $C_1$–$C_{18}$ alkoxy, $C_6$–$C_{18}$ aryloxy or aralkoxy ($C_6$–$C_{18}$ aryl, $C_1$–$C_{18}$ alkyl), $R_1$ and $R_2$ being the same or different or together to form a ring, and $R_3$, $R_4$ and $R_5$ are a tertiary alkyl of 4 to 18 carbon atoms, or a tertiary cycloalkyl of 5 or 6 carbon atoms, or is a $C_6$–$C_{18}$ cycloalkyl, $C_6$–$C_{18}$ aryl, or 5-membered or 6-membered heterocyclic radical containing S, N or O as heteroatoms which contain substituents A and B bonded at least to the two ring carbon atoms, capable of substitution, which are adjacent to the point of attachment to the carbonyl group of the $R_3$ group, A and B being identical or different, and each being $C_1$–$C_{18}$ alkyl, $C_1$–$C_{18}$ alkoxy, $C_1$–$C_{18}$ alkoxy, $C_1$–$C_{18}$ alkyl, $C_1$–$C_{18}$ alkylthio, $C_6$–$C_{18}$ cycloalkyl, $C_6$–$C_{18}$ aryl or halogen $R_3$, $R_4$ and $R_5$ can be the same or different.

23. A process for enhancing the photosensitivity of an acyl or diacyl phosphine oxide compound comprising combining with said acyl or diacyl phosphine oxide compound a fluorescent optical brightener selected from the group consisting of 2,2'-(thiophenediyl)-bis-(t-butyl benzoxazole); 2-(stibyl-4")-(naphtho-1',2',4,5)-1,2,3-triazole-2"-sulfonic acid phenyl ester; and 7-(4'-chloro-6"-diethylamino-1'.3',5'-triazine-4'-yl)amino-3-phenyl coumarin, wherein said optical brightener is present in an amount sufficient to enhance the photosensitivity of the acyl or diacyl phosphine oxide.

* * * * *